United States Patent
Suzuki et al.

(10) Patent No.: US 6,495,814 B1
(45) Date of Patent: Dec. 17, 2002

(54) PHOTO SENSOR WITH SIGNAL PROCESSING CIRCUIT

(75) Inventors: Yasutoshi Suzuki, Okazaki (JP); Inao Toyoda, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/559,181

(22) Filed: Apr. 27, 2000

(30) Foreign Application Priority Data

Apr. 28, 1999 (JP) ............................................. 11-121166
Feb. 21, 2000 (JP) ....................................... 2000-042896

(51) Int. Cl.[7] ............................................. H01L 27/00
(52) U.S. Cl. ................................. 250/208.1; 250/214.1; 257/294
(58) Field of Search ........................... 250/208.1, 214 R, 250/214.1, 216; 257/292, 294, 432, 430, 435, 436; 216/26, 33; 348/272, 274, 340

(56) References Cited

U.S. PATENT DOCUMENTS 5,189,500 A * 2/1993 Kusunoki ..................... 349/17
5,504,376 A * 4/1996 Sugahara et al. ............ 257/768
5,779,918 A 7/1998 Inoue et al.
6,259,083 B1 * 7/2001 Kimura .................... 250/208.1

FOREIGN PATENT DOCUMENTS

JP 61-281559 12/1986
JP 10-173158 6/1998

* cited by examiner

Primary Examiner—Kevin Pyo
(74) Attorney, Agent, or Firm—Law Offices of David G. Posz

(57) ABSTRACT

A photo sensor has a first silicon chip and a second silicon chip mounted on the first silicon chip. Photodiodes are formed in an upper surface portion of the second silicon chip to transform light into electric signals, and circuit elements such as a transistor are formed in an upper surface portion of the first silicon chip to form a signal processing circuit, which manipulates the electric signals from the photodiodes. A metallic thin film is provided on the lower surface of the second silicon chip to cover the circuit element as a shielding film.

19 Claims, 15 Drawing Sheets

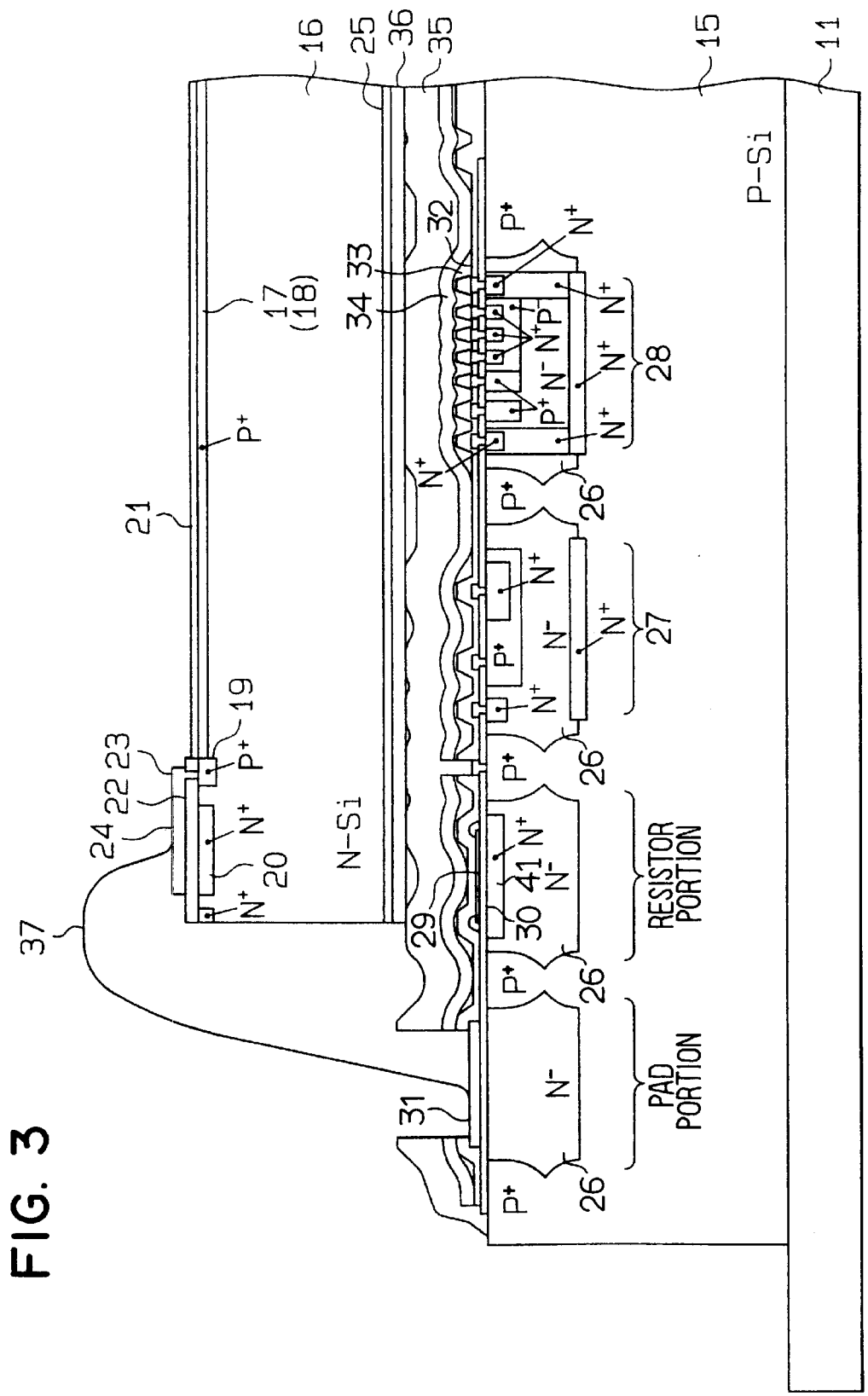

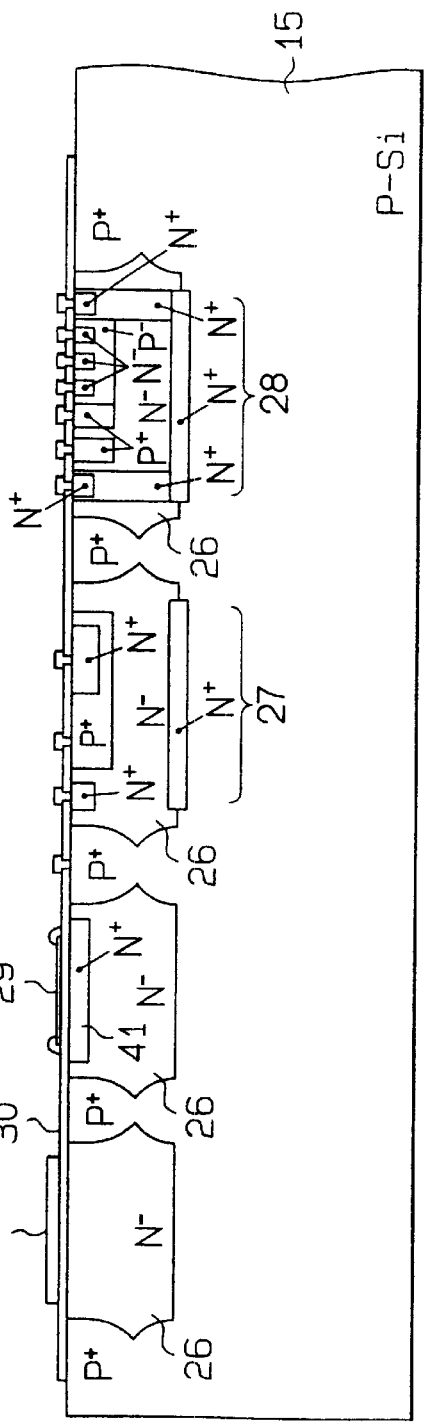

PHOTO SENSOR WITH SIGNAL PROCESSING CIRCUIT

CROSS REFERENCE TO RELATED APPLICATIONS

This application is based upon and claims the benefit of Japanese Patent Applications No. 11-121166 filed on Apr. 28, 1999, and No. 2000-42896 filed on Feb. 21, 2000, the contents of which are incorporated herein by reference.

BACKGROUND OF THE INVENTION

1. Field of the Invention

This invention relates generally to photo sensors, and particularly to vehicle photo sensors, which are suitable for an auto-light sensor for automatically turning on or off a headlight, a sunlight sensor for detecting a quantity of solar radiation to control a vehicle air conditioner, and the like.

2. Description of the Related Art

In recent years, a vehicle photo sensor is required to include a sensing element (photodiode) and a signal processing circuit, which are integrated in one chip, to achieve size reduction, functional improvement, and low cost thereof. This kind of photo sensor is disclosed in JP-A-10-173158. The photo sensor has a shielding film for covering a transistor, and determines a distance between a shielding film edge portion and a transistor edge portion to securely prevent faulty operation of the transistor caused by strong light (sunlight).

In the photo sensor, however, the shielding film must be formed at a wide region to prevent the faulty operation of the transistor, resulting in large chip size. When the photo sensor is used as an auto-light sensor, the photo sensor is required to have sufficient sensitivity to detect very weak sunlight in the evening with low illuminance, especially immediately before sunset. Because of this, an area of a photodiode for sensing sunlight needs to be increased so that a detection signal is increased. This results in further increased chip size. In the conventional sensor, because the photodiode is formed in the same substrate as that for circuit elements for constituting the signal processing circuit, the substrate cost and processing cost are high. Further, because the photodiode is disposed at the central portion of the substrate, the layout of the circuit elements is limited by the photodiode.

SUMMARY OF THE INVENTION

The present invention has been made in view of the above problems. An object of the present invention is to provide a photo sensor with a reduced size at low cost, while preventing faulty operation of a circuit thereof.

According to the present invention, a photo sensor has a first semiconductor chip and a second semiconductor chip mounted on the first semiconductor chip. A photoelectric transformation element for transforming a quantity of light incident thereon into a signal is provided in a surface portion of the second semiconductor chip, and a circuit element for manipulating the signal is provided in a surface portion of the first semiconductor chip under the second semiconductor chip. Further, a shielding film is disposed between the first and second semiconductor chips.

The shielding film prevents light from entering the circuit element to prevent faulty operation of the circuit element. Further, because the photoelectric transformation element and the circuit element are provided in the separate semiconductor chips, each size of the chips and the area of the shielding film are decreased and the manufacturing cost is reduced. The layout of the circuit element is not limited by the photoelectric transformation element.

BRIEF DESCRIPTION OF THE DRAWINGS

Other objects and features of the present invention will become more readily apparent from a better understanding of the preferred embodiments described below with reference to the following drawings, in which;

FIG. 3 is a cross-sectional view taken along line III—III in FIG. 2A;

FIGS. 6 to 16 are cross-sectional views showing a manufacturing process of the photo sensor in a stepwise manner;

DETAILED DESCRIPTION OF THE PREFERRED EMBODIMENT

A preferred embodiment of the present invention will be explained with reference to appended drawings below. A photo sensor in the embodiment is mounted on a vehicle to detect a quantity of solar radiation to control an air conditioner, and to detect a quantity of outside light to control a headlight or the like.

Figure 1:
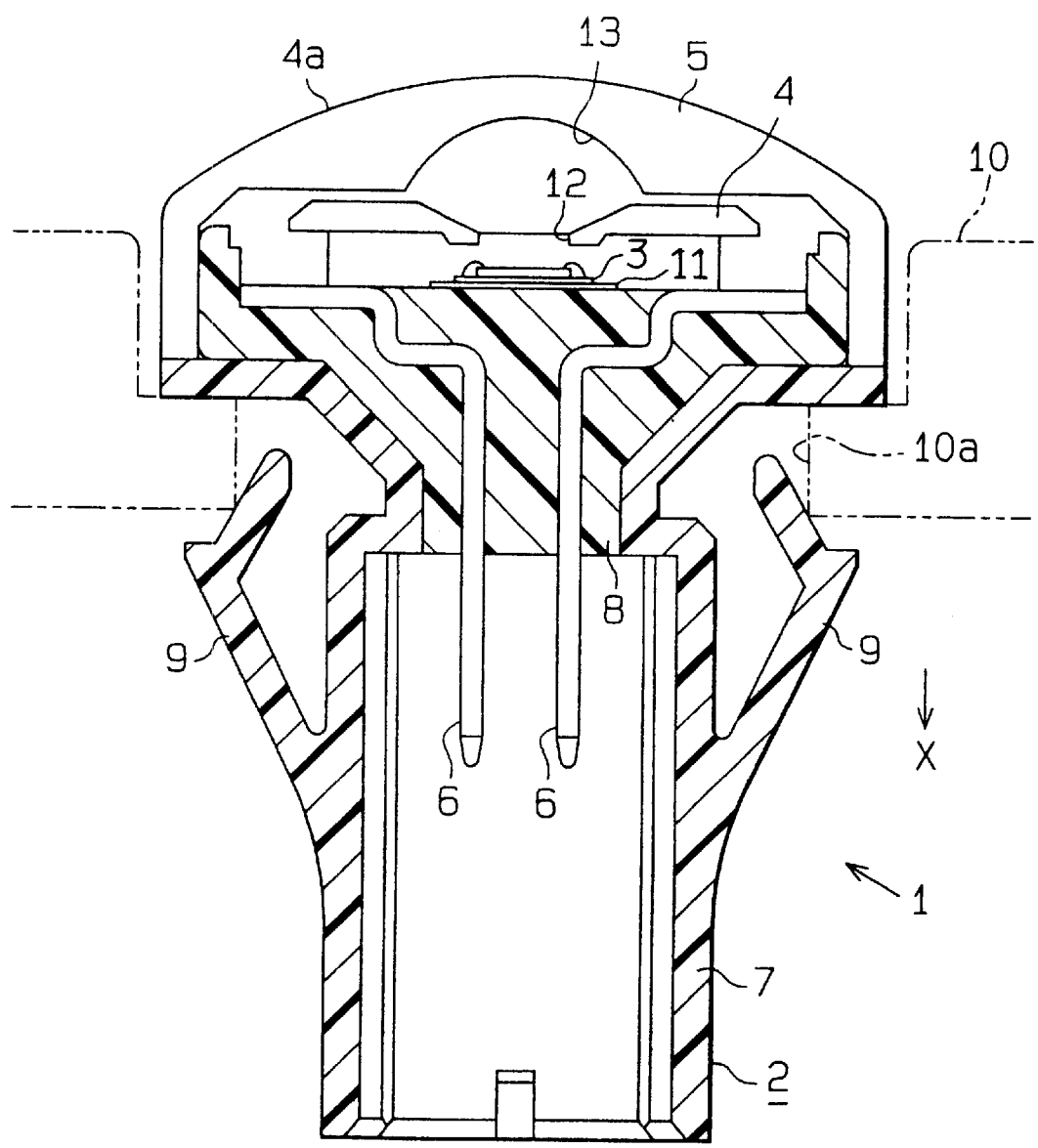
FIG. 1 is a cross-sectional view showing a photo sensor in a preferred embodiment according to the present invention.

Referring first to FIG. 1, the photo sensor 1 has a sensor housing 2 capable of functioning as a connector, a slit plate (shielding plate) 4, an optical lens 5, and terminals 6. The sensor housing 2 is composed of a cylindrical case 7 and a holder 8, which are made of synthetic resin. The case 7 is disposed for practical usage with an axis approximately parallel to a vertical direction. The holder 8 is inserted into an upper portion of the case 7. The housing 2 can comply with various sensor specifications by exchanging the holder 8 (photoelectric transformation element mounting portion and connector portion) in accordance with the sensor specifications while using the case 7 as a common member.

Claws 9 are provided on an outer circumference wall of the case 7 for sensor attachment. The photo sensor 1 is inserted into a hole 10a of a vehicle dashboard 10 in direction X in FIG. 1, and the photo sensor 1 is fixedly attached to the dashboard 10 by forces imparted from the claws 9 outwardly.

A sensor chip 3 is disposed on a base 11, which is disposed on the upper central portion of the holder 8. The terminals 6 are insert-molded into the holder 8 as output terminals for outputting sensor signals therefrom. Each of the terminals 6 has one end exposed at the upper surface of the holder 8, and the other end protruding from the lower surface of the holder 8. The upper end of each terminal 6 is electrically connected to the sensor chip 3.

The slit plate 4 is supported by the upper surface of the holder 8 to cover the sensor chip 3. The slit plate 4 is made of shielding material, and has a slit (transparent hole) 12 at the central portion thereof. The slit 12 is positioned immediately above the sensor chip 3. The optical lens 5 is made of colored glass or resin (translucent material), and has a cup-like shape. The optical lens 5 fits the outer circumference surface of the holder 8, and is supported by the holder 8 to be disposed above the sensor chip 3. A recess 13 is formed at the central portion of the inner (lower) wall of the optical lens 5 so that the optical lens 5 has a lens function. In the embodiment, the optical lens 5 and the slit plate 4 constitute a luminous energy control member for controlling a quantity of light incident on the sensor chip 3 in accordance with an incident angle of the light.

Figure 2A:
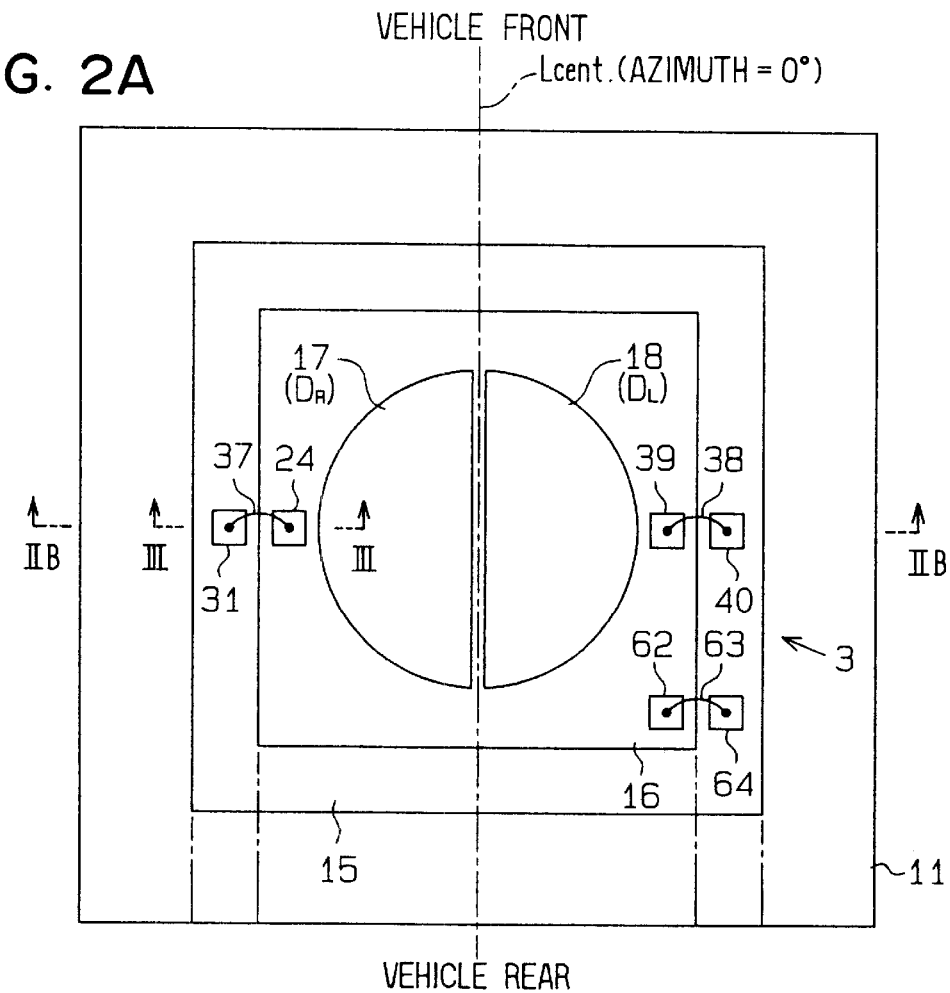
FIG. 2A is a plan view showing a sensor chip of the photo sensor.
Figure 2B:
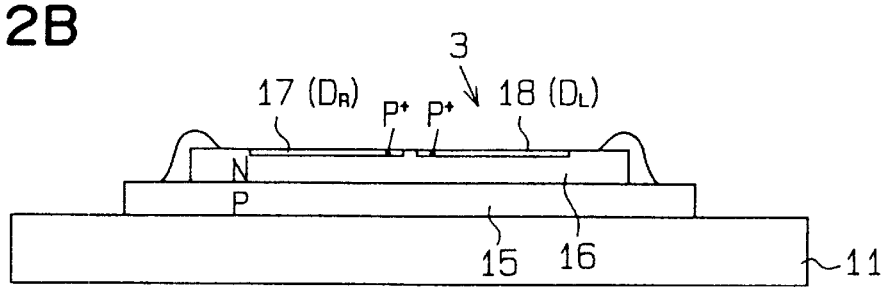
FIG. 2B is a cross-sectional view taken along line II B—II B in FIG. 2A.

FIG. 2A shows the sensor chip 3 disposed on the base 11, FIG. 2B is a cross-section taken along line IIB—IIB in FIG. 2A, and FIG. 3 is a cross-section taken along line III-III in FIG. 2A. As shown in FIGS. 2A and 2B, a second silicon chip (substrate) 16 is mounted on an upper surface of a first silicon chip (substrate) 15. The second silicon chip 16 is composed of an N-type silicon substrate having $P^+$ type regions 17, 18 in a surface portion thereof, and photo current is produced in this PN junction portion by light radiation. The $P^+$ type regions 17, 18 constitute photodiodes (photoelectric transformation elements) DR, DL, respectively.

The $P^+$ regions 17, 18 have a semi-circular shape, respectively, and are arranged symmetrically with respect to an axis Lcent extending in a longitudinal (front and rear) direction of a vehicle. Accordingly, a 2D (2-element) type photo sensor is provided to detect a right/left azimuth of solar radiation as a solar radiation sensor. The axis Lcent is a reference axis where the azimuth is zero degree.

As shown in FIG. 3, a $P^+$ type region 19 is formed at an end of the $P^+$ type region 17 in the surface portion of the silicon chip 16, and an $N^-$ type region 20 is separately formed at an outer circumference side of the $P^+$ type region 19. A thin silicon oxide film 21 and a thick silicon oxide film 23 are formed on the surface of the silicon substrate 16. A wiring member 23 made of aluminum is disposed to contact the $P^+$ type region 19, and is connected to a bonding pad 24. The bonding pad 24 is, as shown in FIG. 2A, disposed at an outer peripheral portion of the silicon chip 16. This is a constitution of the photodiode DR, and the photodiode DL has substantially the same constitution as that of the photodiode DR, with a bonding pad 39. A bonding pad 62 is connected to the $N^+$ type region 20 via an aluminum wiring layer (not shown).

Further, referring again to FIG. 3, a metallic film 25 is formed entirely on the back surface (lower surface) of the second silicon chip 16. The metallic film 25 is made of electrode material such as Al, or Au/Ni/Ti, and functions as a shielding film for covering circuit-formation elements, described below. Thus, the $P^+$ type regions 17, 18 formed in the surface portion of the N type silicon chip 16 constitute the photodiodes DR, DL, and the photodiodes DR, DL transform light incident thereon into electric signals (photo currents), which are taken out from the pads 24, 39.

On the other hand, the first silicon chip 15 is composed of a P type silicon substrate, and an $N^-$ type epitaxial layer 26 is formed in the surface portion of the silicon chip 15. The $N-$ type layer 26 includes many island portions isolated from one another by PN junctions, and a circuit element for constituting a signal processing circuit is formed in each of the island portions. The signal processing circuit manipulates the electric signals from the photodiodes DR, DL. FIG. 3 shows a transistor 27 and a IIL element 28 as circuit elements.

The IIL element 28 has P type and N type impurity-diffusion regions connected to aluminum wiring members. Similarly, the transistor 27 has P type and N type impurity-diffusion regions connected to aluminum wiring members. In a thin film resistor portion, a thin film resistor element 29 is formed on a silicon oxide film 30 by depositing a Cr—Si film by sputtering and by patterning the film into a specific shape by photo etching. Aluminum wiring members are connected to both ends of the thin film resistor element 29. The thin film resistor element 29 partially undergoes laser trimming after wire bonding is performed. In FIG. 3, although the thin film resistor element 29 is disposed under the Ntype silicon chip 16, in practice, the thin film resistor element 29 is disposed not to be covered with the N type silicon chip 16 similarly to the pads.

The signal processing circuit has other elements such as a resistor and a capacitor in addition to the transistor 27 and the IIL element 28, which are manufactured by performing an ordinal diffusion technique and the like to the silicon chip 15.

A bonding pad 31 is disposed on the silicon oxide film 30 at an outer peripheral portion of the first silicon chip 15. The aluminum wiring members disposed on the silicon chip 15 are covered with a TEOS oxide film 32, an SOG film 33, a TEOS oxide film 34, and a surface protective film 35 formed in this order. The second silicon ship 16 is bonded through an adhesive layer (sheet) 36 to the first silicon chip 15 having the above constitution. In this state, the metallic film 25 as the shielding film is positioned above the circuit elements (27, 28) constituting the signal processing circuit. The metallic film 25 prevents faulty operations of the circuit elements (27, 28), i.e., faulty operation of the signal processing circuit.

Here, as shown in FIG. 2, the size of the first silicon chip 15 in which the signal processing circuit is formed is larger than that of the second silicon chip 16 in which the photodiodes are formed. This makes it easy to bond the second silicon chip 16 to the first silicon chip 15. The size of the silicon chip 15 is determined based on the distance from the shielding film edge portion for preventing faulty operation of the signal processing circuit. As shown in FIG. 3, the transistor 27 is not disposed on the peripheral portion of the chip 15, which is not covered with the second silicon chip 16, and passive elements such as the thin film resistor element 29 are disposed on the peripheral portion.

The pad 24 of the silicon chip 16 is connected to the pad 31 of the silicon chip 15 via a bonding wire 37. Similarly, the pad 39 of the silicon chip 16 of the photodiode DL is connected to a pad 40 of the silicon chip 15 via a bonding wire 38. The pad 62 of the silicon chip 16 is connected to a pad 64 of the silicon chip 15 via a bonding wire 63.

Light externally incident on the photodiodes DR, DL reaches the $P^+$ type regions 17, 18 after passing through the silicon oxide film 21. When light enters a vicinal region of the PN junction between the N type substrate and the $P^+$ type regions, electron-hole pairs are produced at the PN junction. Produced minority carriers, i.e., electrons produced in the $P^+$ type region and holes produced in the N type substrate move in the respective regions in directions opposite to each other. Accordingly, photo current flows from the N type substrate to the $P^+$ type region. The photo current is in proportion to a quantity of incident light. The photo current is transmitted to the signal processing circuit through the pad 24 (39) and the bonding wire 37 (38), and is manipulated in a specified manner. Incidentally, an N⁺ type region 41 is formed beneath the thin film resistor element 29.

Figure 4:
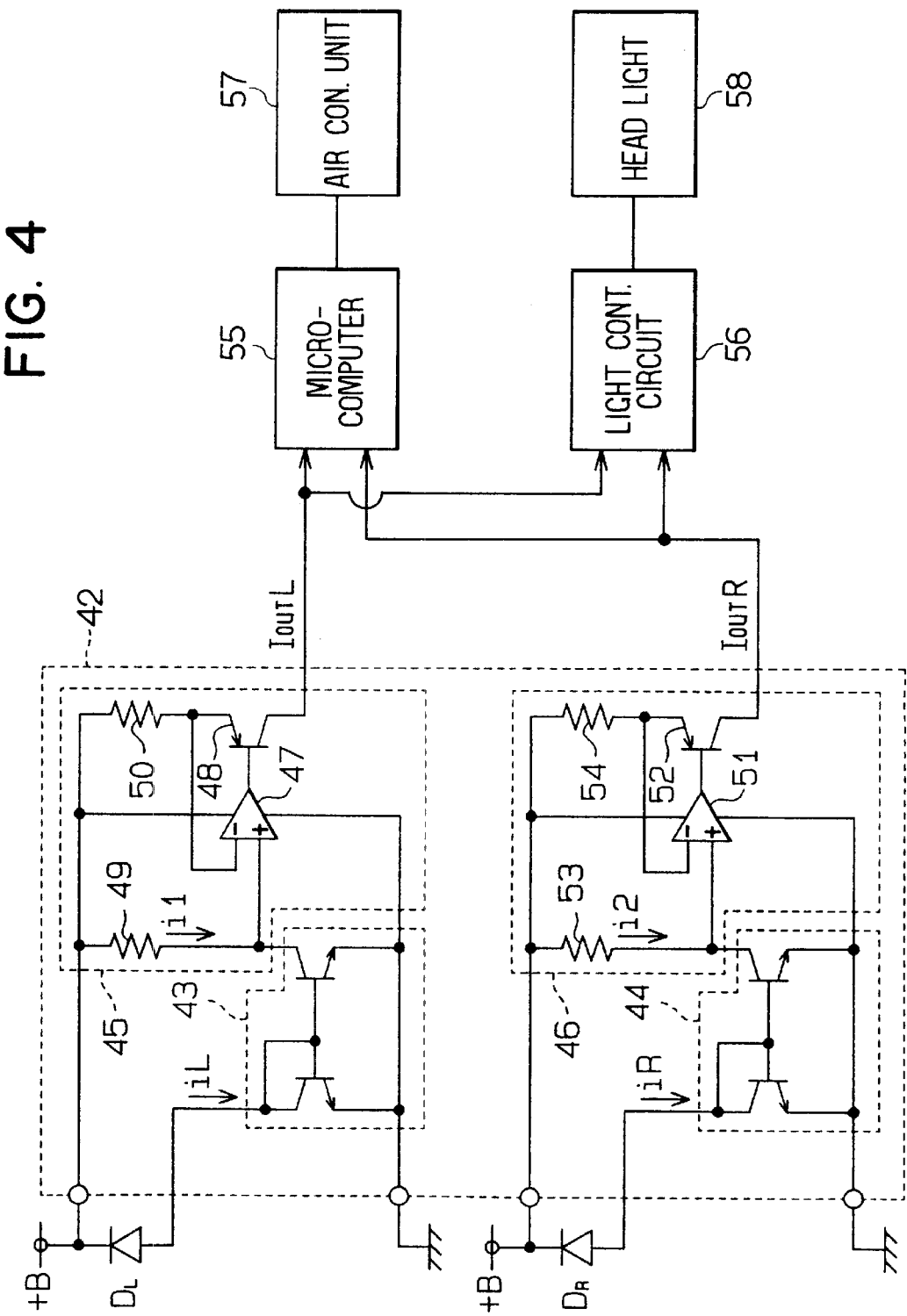
FIG. 4 is a diagram showing a circuit constitution of the photo sensor.

FIG. 4 shows an electrical constitution of the signal processing circuit for manipulating signals outputted from the photodiodes DR, DL. The signal processing circuit 42 includes current mirror circuits 43, 44, and processing circuits 45, 46. The photodiode DL is connected to the current mirror circuit 43, and outputs a signal, i.e., photo current iL, in accordance with the quantity of incident light. Similarly, the photodiode DR is connected to the current mirror circuit 44 and outputs a signal, i.e., photo current iR, in accordance with the quantity of incident light.

The processing circuit 45 is a current amplifier circuit for amplifying signal i1 produced by the current mirror circuit 43, and is composed of an operation amplifier 47, a transistor 48, and resistors 49, 50. The processing circuit 45 produces and outputs current signal IoutL proportional to the signal i1. Similarly, the processing circuit 46 is a current amplifier circuit for amplifying signal i2 produced by the current mirror circuit 44, and is composed of an operation amplifier 51, a transistor 52, and resistors 53, 54. The processing circuit 46 produces and outputs current signal IoutR proportional to the signal i2.

Figure 5:
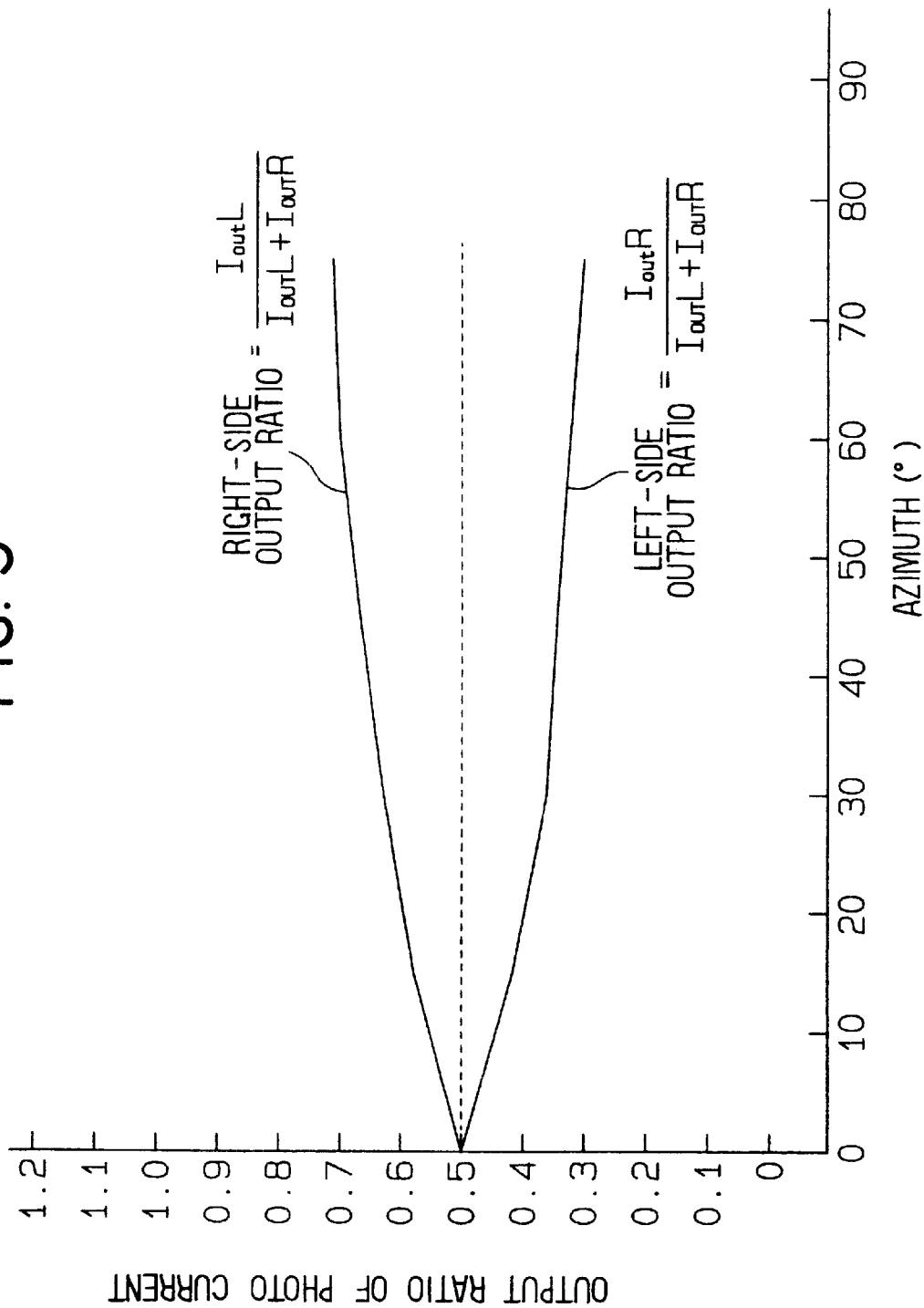
FIG. 5 is a graph showing an output ratio of photo current with respect to an azimuth.

The side receiving sunlight (driver's seat side or passenger's seat side) and the quantity of sunlight can be determined by the signals IoutL and IoutR. Specifically, as shown in FIG. 5, the azimuth can be determined by an output ratio (=IoutR/(IoutL+IoutR), or IoutL/(IoutL+IoutR)), and the total quantity of incident light can be detected by (IoutL+IoutR). Thus, when the photo sensor 1 is used as a sunlight sensor, output signals IoutL and IoutR are detected in accordance with the incident direction and the quantity of sunlight. On the other hand, when the photo sensor 1 is used for controlling a vehicular light, an output signal, IoutL+IoutR, is detected in accordance with light incident thereon not directly from the sun but via entire ambience thereof, for instance, in the evening or in a tunnel. At that time, because both the photodiodes DR, DL are used, weak light can be detected effectively.

In FIG. 4, the processing circuits 45, 46 are connected to a microcomputer 55 for an air conditioner and a light control circuit 56. The microcomputer 55 controls an air conditioning unit 57, which has a blower, a cooler, a heater and the like, and is mounted in an instrument panel of the vehicle. The microcomputer 55 ingests the output signals IoutL and IoutR, and controls the air conditioner unit 57 to increase a quantity of air blown off toward the side (driver's seat side or passenger's seat side)on which sunlight is incident. As a result, temperature is lowered at the side. Further, the light control circuit 56 controls turning on/off of the headlight 58.

Next, the operation of the photo sensor 1 will be explained. Referring back to FIG. 1, light irradiated on the surface of the optical lens 5 passes through the optical lens 5 to be incident on the slit plate 4. The light then passes through the slit 12 of the slit plate 4, and is incident on the photodiodes DR, DL of the sensor chip 3. The photodiodes DR, DL output the signals in response to the light incident thereon. That is,light incident on the sensor surface (optical lens 5) progresses toward the sensor chip 3 through the slit 12 with an optical path, which is changed by the refractive index and the shape of the lens 5.

At that time, referring to FIG. 2A, light coming in the immediately above direction with an elevation angle of 90° is conducted to the sensor chip 3 through the slit 12 from the optical lens 5 and is incident on the axial Lcent. Light coming in not the immediately above direction but right or left direction with a low elevation angle is incident on the sensor chip 3 with a low elevation angle is incident on the sensor chip 3 with a quantity, distribution of which on the sensor chip 3 is not symmetric with respect to the axis Lcent. The incident direction of light is opposite to the side of the sensor chip 3 receiving light, a quantity of which is larger than that on the other side. Thus, the quantity of incident light is controlled by the optical lens 5 and the slit plate 4, and is incident on the surface of the sensor chip 3. The radiation area at the light receiving side varies in accordance with the angle (azimuth) of incident light.

Each of the photodiodes DR, DL, which are arranged at the right and left sides of the axis Lcent where the azimuth is zero, receives light incident thereon, and transforms the light into an electric signal in accordance with the amount of light. Then, the signal processing circuit 42 shown in FIG. 4 produces the current signals IoutR and LoutL in accordance with photo currents flowing in the photodiodes DR and DL. The microcomputer 55 for the air conditioner determines the quantity and the azimuth of sunlight by the current signals IoutR and IoutL, and air-conditions right and lefts sides of the vehicle, independently, based on the determined quantity and azimuth of sunlight. The light control circuit 56 turns on or turns off the headlight 58 automatically by the sum of the current signals IoutR and IoutL. Specifically, the headlight 58 is turned on in the evening or in a tunnel, and is turned off when the vehicle passes through the tunnel in the daytime automatically.

The circuit elements such as the transistor 27 and the IIL element 28 constituting the signal processing circuit on the silicon chip 15 is covered with the metallic film 25 for forming a back surface electrode of the second silicon chip 16. The metallic film 25 functions as a shielding film, which prevents sunlight from entering the transistor 27 and the like directly. As a result, a faulty operation of the signal processing circuit is not caused by sunlight incident thereon.

More specifically, the photo sensor 1 detects sunlight having a spectral distribution expanding to a near infrared region. Therefore, sunlight partially passes through the silicon chip 16 in which the photodiodes DR and DL are formed and reaches the surface of the circuit elements. That is, according to a photo absorption coefficient of silicon, sunlight is shielded by the silicon chip 16 having a thickness of 400 μm almost but not completely. Because of this, the metallic film 25 is used as the shielding film to completely prevent sunlight from reaching the surface of the circuit elements.

Next, a manufacturing method of the sensor chip 3 will be explained with reference to FIGS. 6 to 16 showing cross-sections in respective steps taken along line III—III in FIG. 2.

Figure 6:
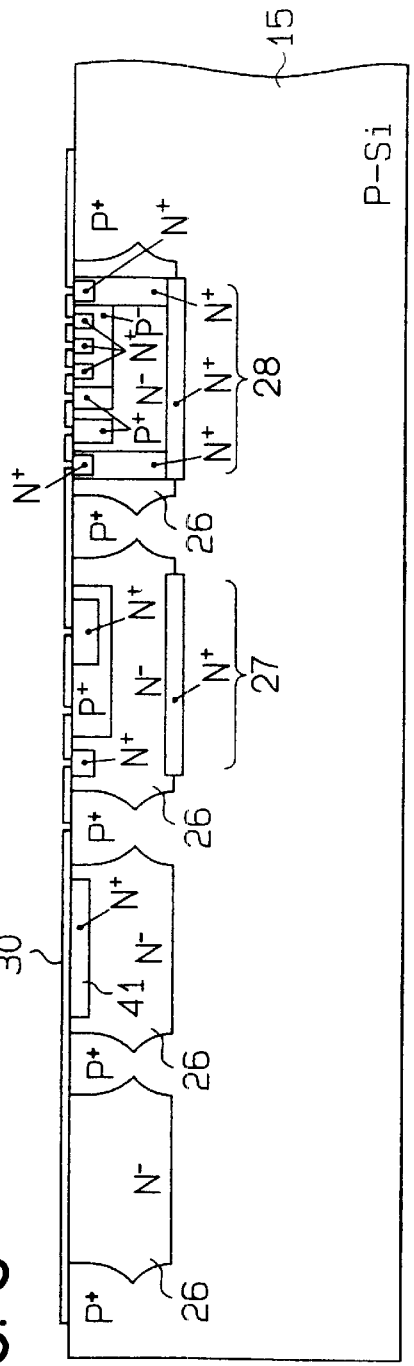

First, as shown in FIG. 6, the N type epitaxial layer 26 is formed in the surface portion of the P type silicon chip 15. The transistor 27, the IIL element 28, and the like constituting the signal processing circuit are formed in the silicon chip 15 by an ordinary IC manufacturing method. The silicon oxide film 30 is formed on the silicon chip 15.

Figure 7:
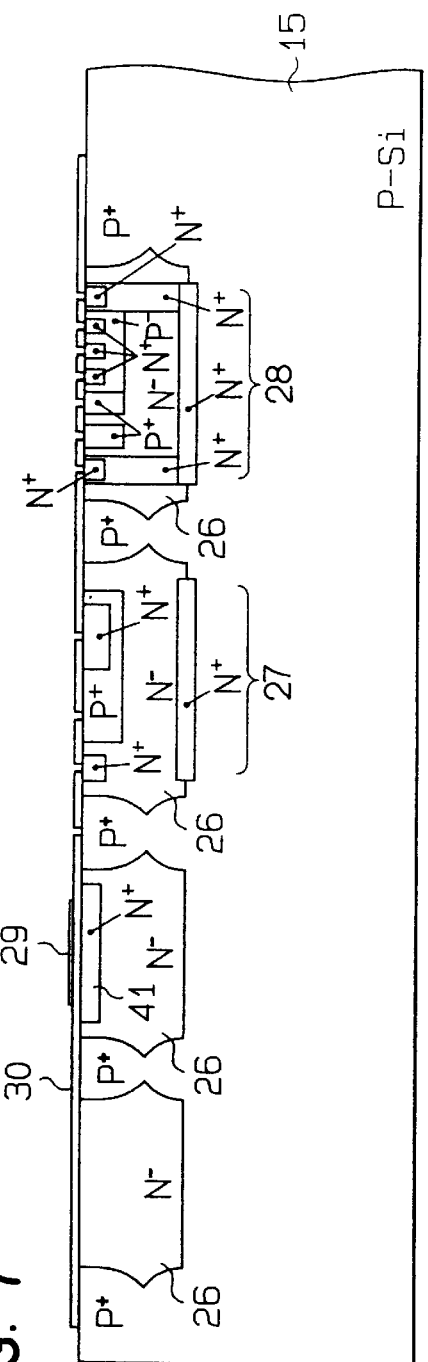
Figure 10:
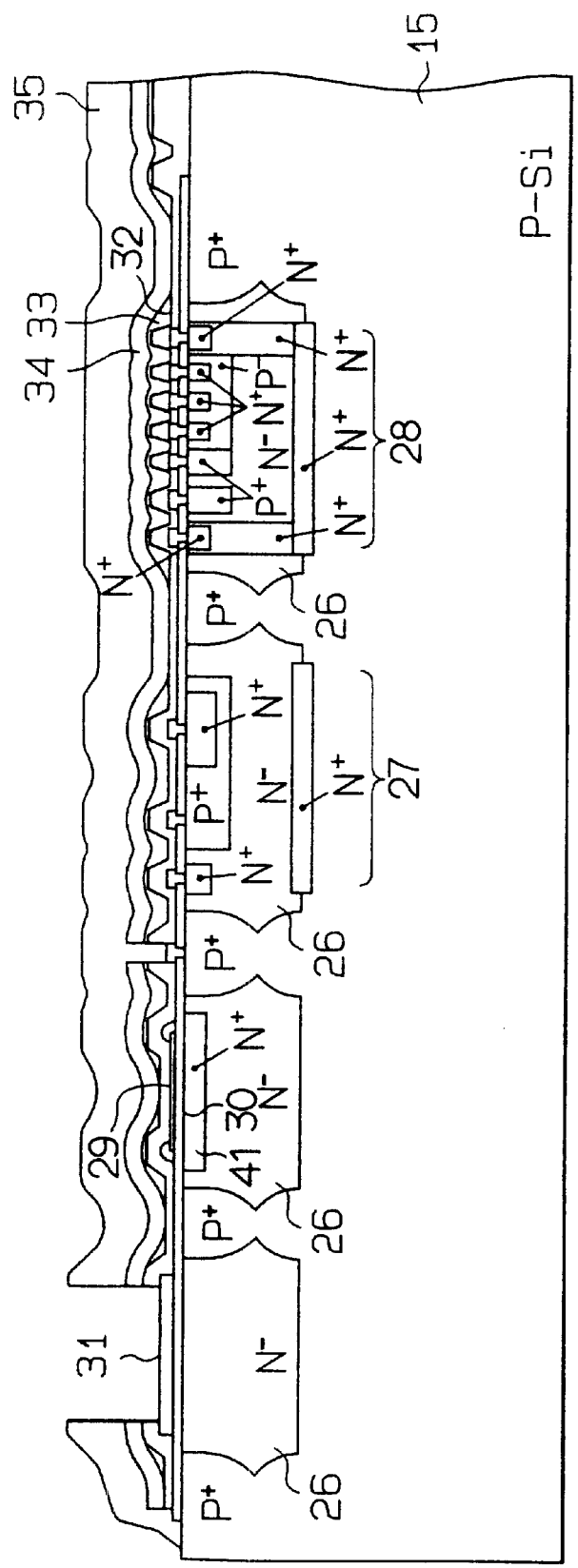

Then, as shown in FIG. 7, the thin film resistor element 29 is formed on the silicon oxide film 30. Further, as shown in FIG. 8, an aluminum wiring layer are formed for forming the aluminum wiring members for the transistor 27, the IIL element 28, the thin film resistor element 29, and the like. The pad 31 is also formed from the aluminum wiring layer. Successively, as shown in FIG. 9, the TEOS oxide film 32, the SOG film 33, and the TEOS oxide film 34 are formed in this order. As shown in FIG. 10, the surface protective film 35 is formed on the TEOS oxide film 34 to expose the pad 31 therefrom.

Figure 11:
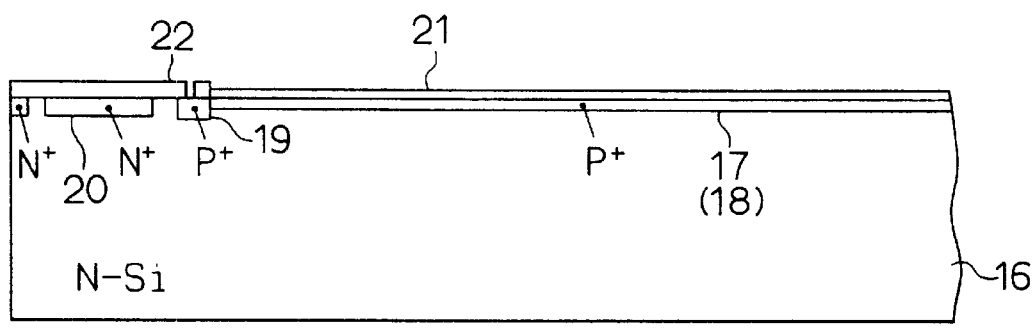
Figure 12:
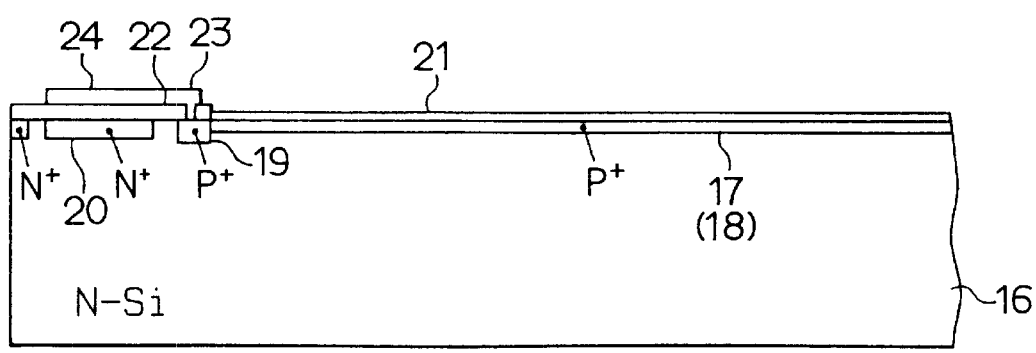
Figure 13:
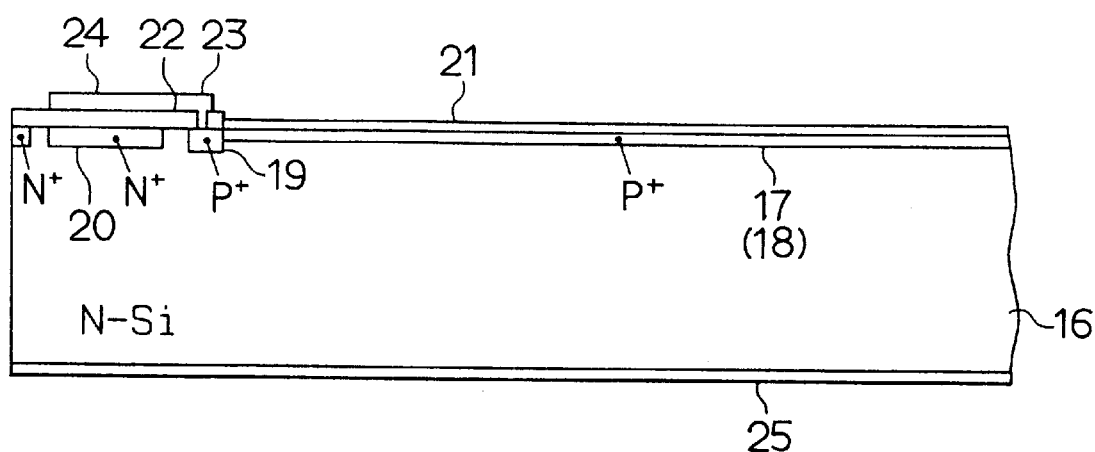
Figure 14:
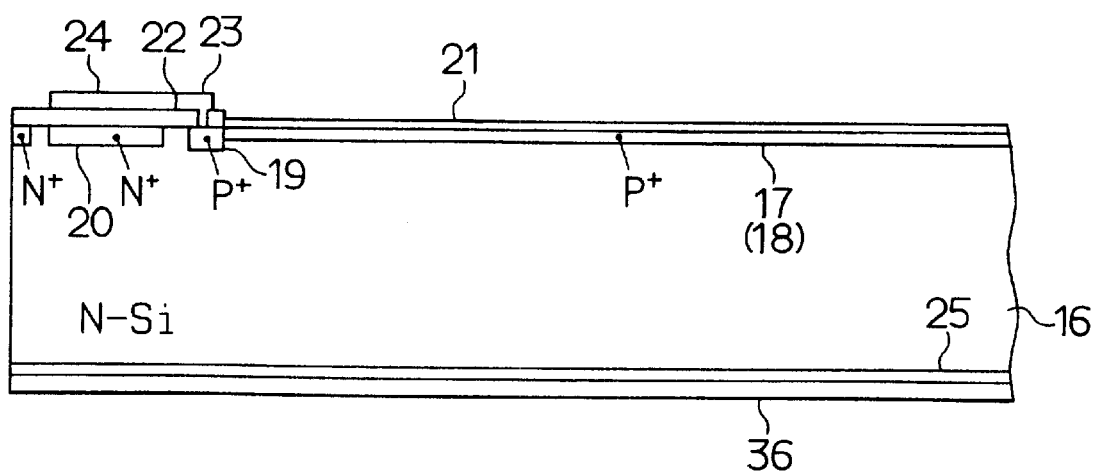
Figure 15:
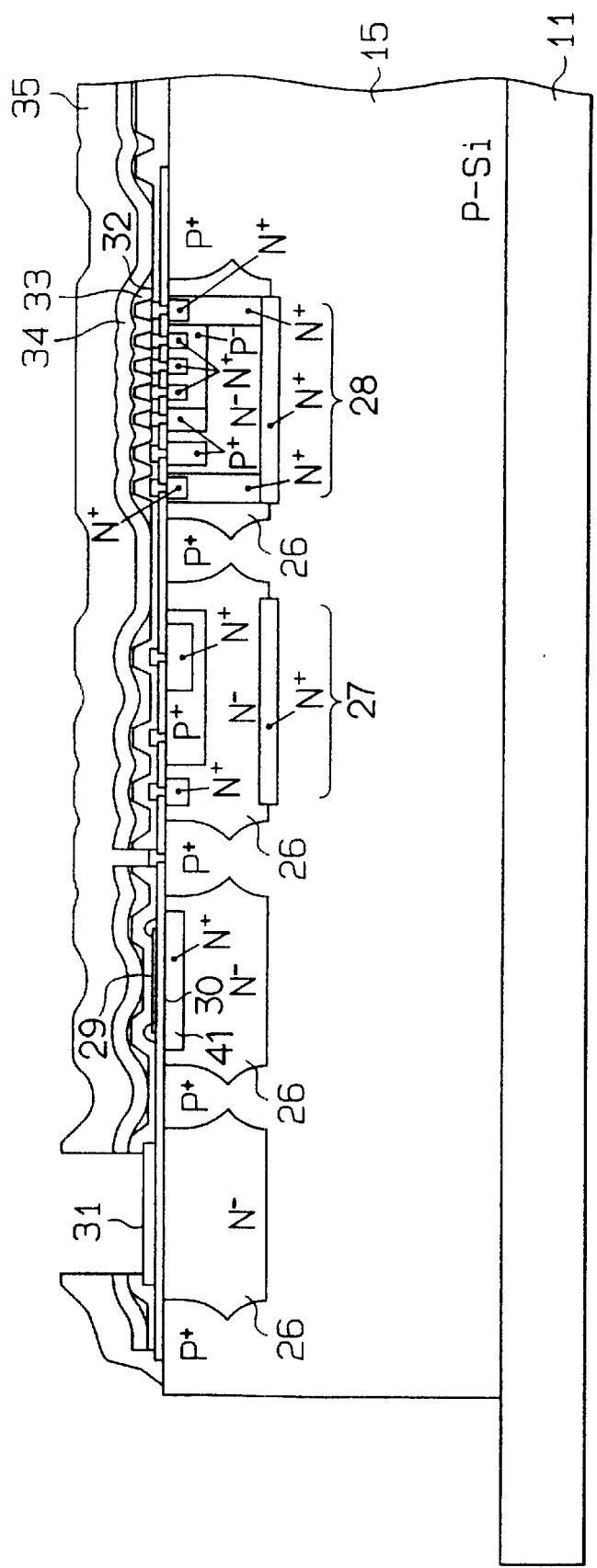

On the other hand, as shown in FIG. 11, the P+type regions 17 (18), 19 and N+ type region 20 are formed in the surface portion of the N type silicon chip 16 by diffusion or the like. The silicon oxide films 21 and 22 are then formed on the silicon chip 16. As shown in FIG. 12, the aluminum wiring member 23 and the pad 24 are formed. After that, as shown in FIG. 13, the metallic film 25 is formed on the whole back surface of the silicon chip 16. As shown in FIG. 14, the adhesive layer 36 is adhered to the metallic film 25 on the silicon chip 16.

Figure 16:
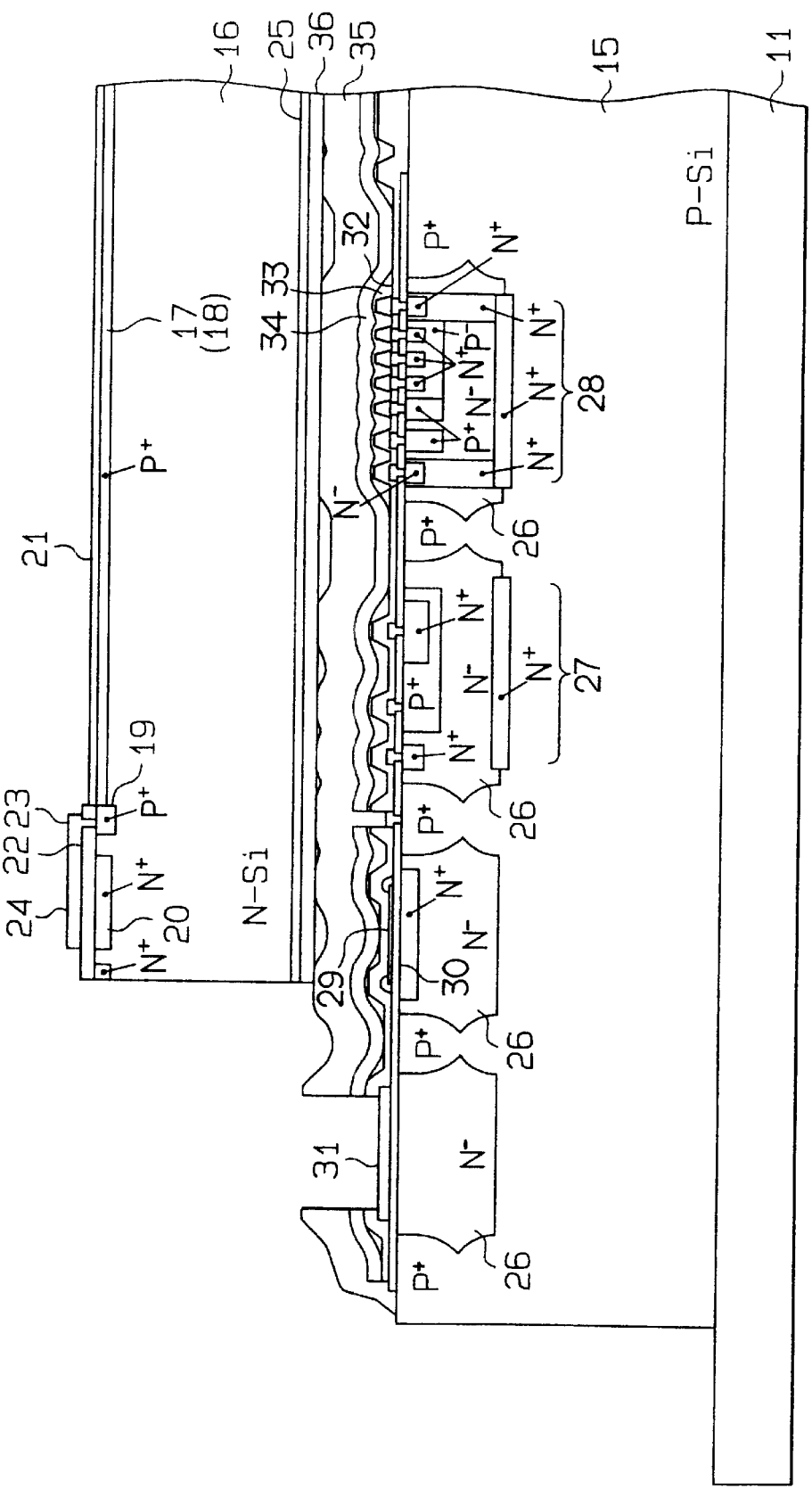

The silicon chip 15 in which the signal processing circuit is formed as described above is, as shown in FIG. 15, bonded to the base 11. As shown in FIG. 16, the silicon chip 16 in which the photodiodes DR and DL are formed is bonded to the silicon chip 15 at a side opposite the base 11. At that time, even if the upper surface of the silicon chip 15 has irregularities, the silicon chip 16 can be bonded to the silicon chip 15 securely through the soft adhesive layer 36. The silicon chip 16 may be bonded to the silicon chip 15 after the upper surface (bonding surface) of the silicon chip 15 is flattened. Finally, as shown in FIG. 3, the pad 24 of the chip 16 and the pad 31 of the chip 15 are bonded to each other via the bonding wire 37 made of gold or the like.

The present embodiment described above has the following features.

The circuit elements such as the transistor 27 constituting the signal processing circuit are formed on the chip 15, which is different from the chip 16 in which the photodiodes DR and DL are formed. Accordingly, the area of the shielding film 25 can be decreased significantly, resulting in chip size reduction. That is, when the diodes and the signal processing circuit are integrally provided on one photo sensor IC chip, the area of the chip must be larger than the sum of the areas of the diodes and the signal processing circuit, for instance, larger than 4 mm$^2$. However, when the chips 15, 16 are laminated with one another as in the present embodiment, the area of the chip 16 for the photodiodes is approximately 2.5 mm$^2$, and the area of the chip 15 for the signal processing circuit is approximately 3 mm$^2$. Even when the size of each of the photodiodes DR and DL is increased to output a large detection signal by detecting significantly weak light, the size of the chip can be reduced.

Further, because the photodiodes DR and DL are formed in the chip 16 different from the chip 15 in which the circuit elements constituting the signal processing circuit are formed, the processing cost is low. Furthermore, as shown in FIG. 3, only one aluminum wiring layer (electrode layer) is formed on the first silicon chip 15. It is not necessary to form two-layer electrode for providing a shielding film as in a conventional one-chip integrated sensor, resulting in additional processing cost reduction. In the conventional sensor, the photodiodes are arranged at the central portion of the conventional one-chip to limit the layout of the circuit elements. To the contrary, the circuit elements of the present embodiment are not limited in layout by the photodiodes. The area of the circuit elements can be readily reduced to achieve the cost reduction.

Thus, the photo sensor can be provided with a reduced size at low cost not to perform faulty operation. In addition, in the conventional one-chip integrated sensor, only the surface portion of the silicon substrate (specifically, only the N$^-$ type epitaxial layer 26 in FIG. 3) is utilized to form the photodiodes. To the contrary, in the present invention, the silicon chip 16 can be utilized wholly in the thickness direction to form the photodiodes therein. As a result, the photo current can be increased. Further, because the metallic film 25 is provided on the back surface of the chip 16, not only light directly entering the chip 16 but also light reflected by the metallic film 25 produce the photo current, thereby increasing output.

Figure 17:
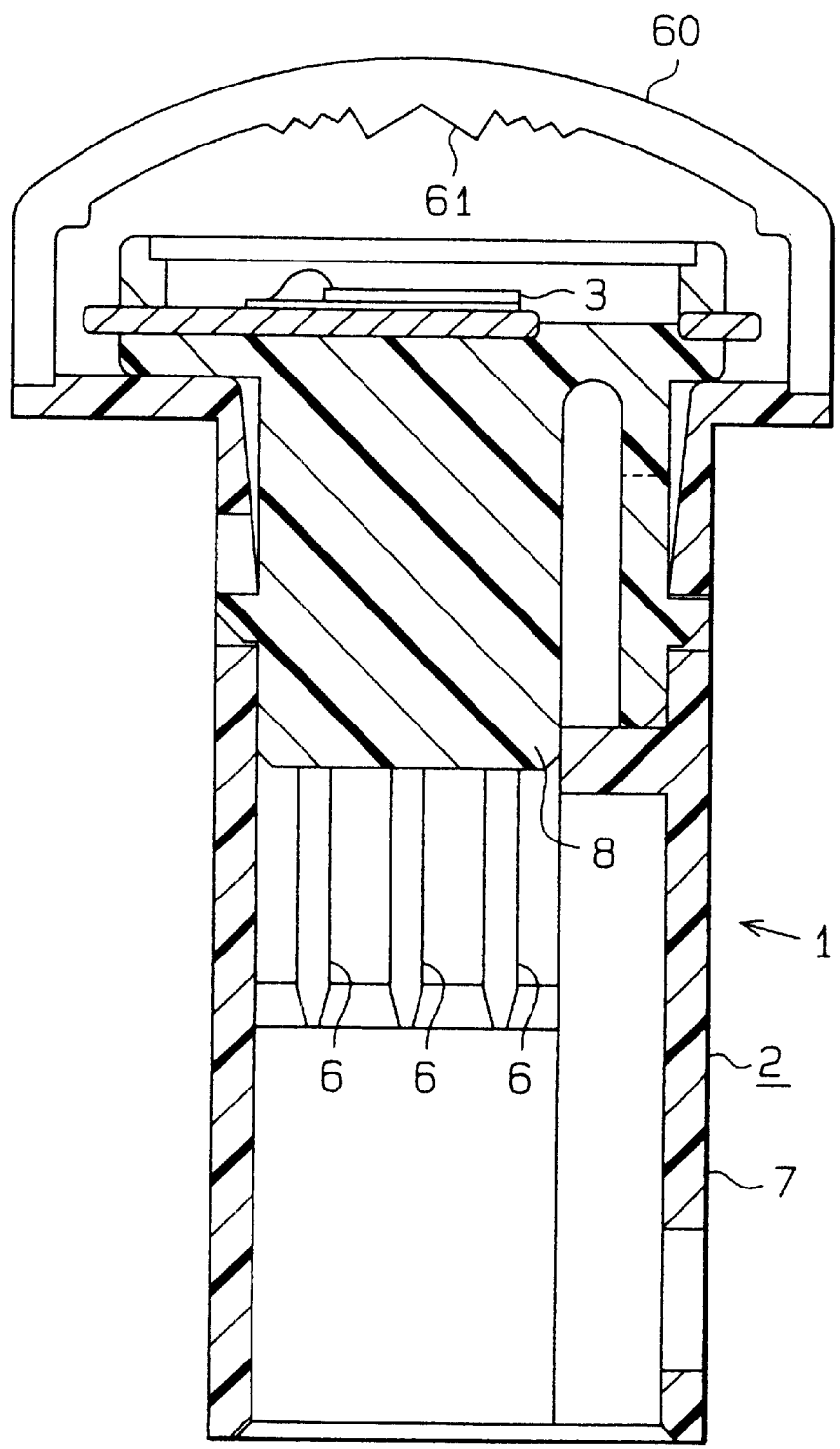
FIG. 17 is a cross-sectional view showing a modified photo sensor according to the present invention.

In the embodiment described above, the photoelectric transformation element is composed of the photodiode, but it is not limited to that. For instance, a phototransistor may be used as the photoelectric transformation element. Further, although the photo sensor in the embodiment described above is a 2D type composed of two photoelectric formation elements, a 1D type photo sensor shown in FIG. 17 may be adopted as well. In FIG. 17, a Fresnel lens 61 is formed on a lower surface of an optical lens 60. That is, a prism-aggregated lens (Fresnel lens) 61 is used to give a lens function to the optical lens 60.

The electrical connection between the chips 15, 16 may be provided by solder or eutectic metal utilizing a through hole of the chip 16, in place of wire bonding. In a flip-chip type, bumps formed on the upper side chip may be joined to the lower side chip by soldering. The shielding film is not limited to a metallic film, but may be made of other material, provided that the material can shield sunlight with a specific thickness.

Figure 18:
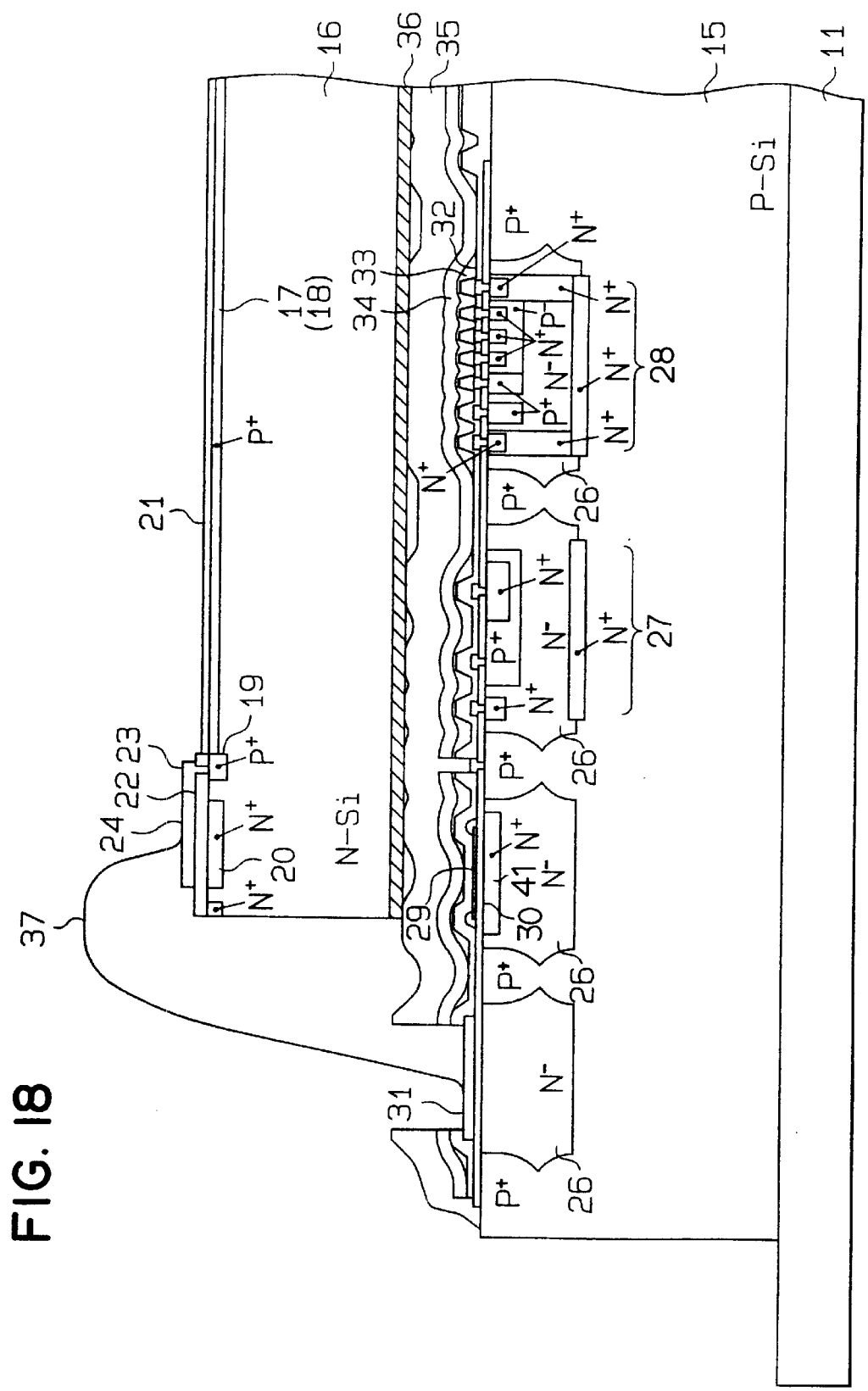
FIG. 18 is a cross-sectional view showing a modified sensor chip according to the present invention.

In FIG. 3, although the shielding film 25 is formed on the back surface (lower surface) of the upper side chip 16, sunlight may be shielded in the following manner without the shielding film 25. Specifically, as shown in FIG. 18, the adhesive layer 36 is formed to have a shielding function. The adhesive layer 36 may be adhesive or a thermo-compression bonding film (laminate) made of polyimide or the like. Fine powders made of carbon or metal are contained in the adhesive layer 36. As a result, the adhesive layer 36 interposed between the two chips 15 and 16 can shield sunlight even when the metallic film 25 is not provided as shown in FIG. 18. In this case, the adhesive layer 36 bonding the chips 15 and 16 together functions as a shielding film.

Figure 19:
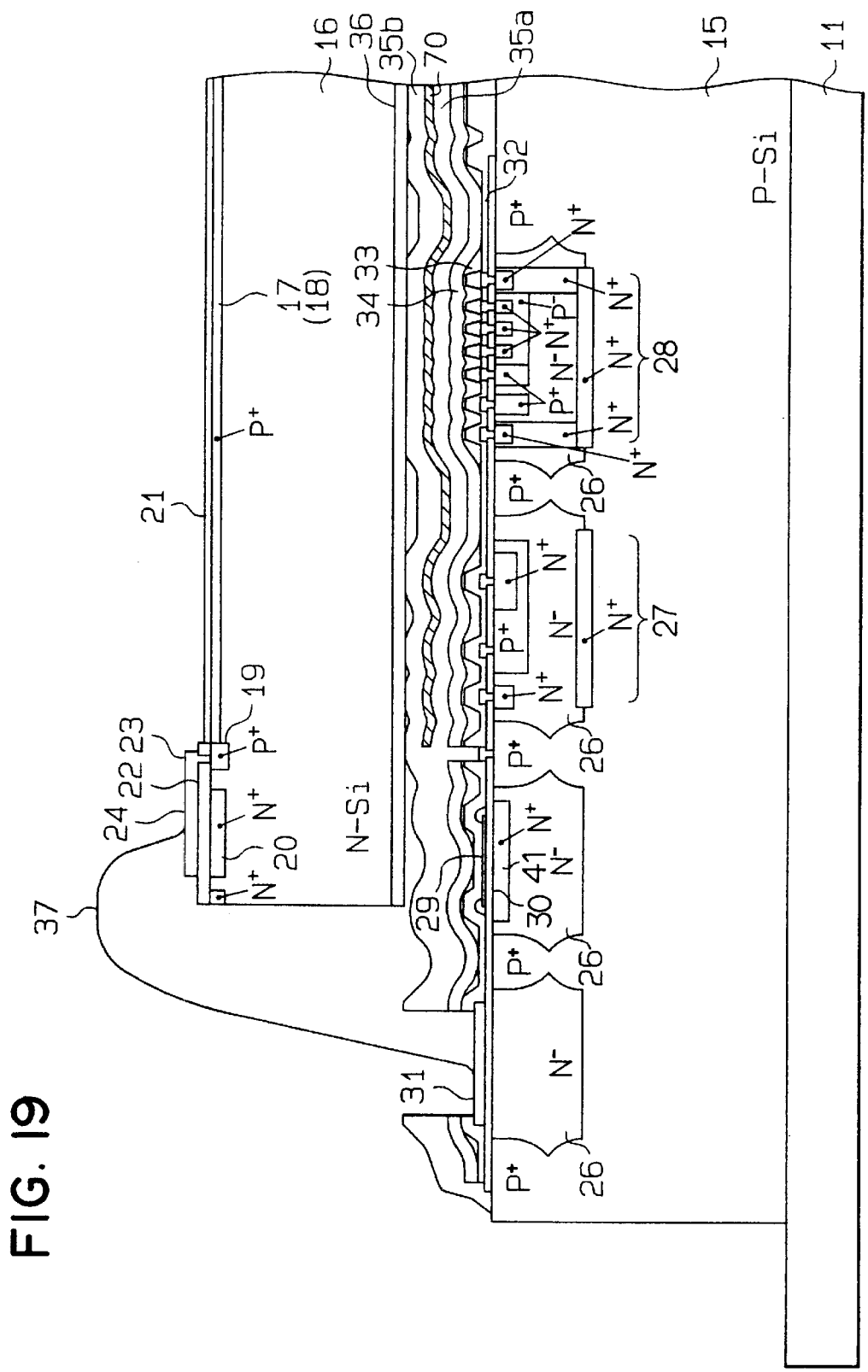
FIG. 19 is a cross-sectional view showing another modified sensor chip according to the present invention.

Otherwise, as shown in FIG. 19, an aluminum shielding film 70 is disposed between two surface protective films 35a and 35b, which are formed on the surface of the silicon chip 15. In this case, the aluminum shielding film 70 is deposited on the surface protective film 35a, and is patterned to expose a specific region so that the thin film resistor element 29 can undergo laser trimming after being wire-bonded. Accordingly, sunlight can be shielded not by the lower surface of the upper side chip 16 but by the shielding film 70 on the lower side chip 15. Thus, the shielding film can be modified in various ways provided that it is disposed between the two chips 15 and 16.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A photo sensor comprising:
   a first semiconductor chip;
   a second semiconductor chip bonded to the first semiconductor chip;
   a photoelectric transformation element provided in a surface portion of the second semiconductor chip at a side opposite to the first semiconductor chip, wherein the photoelectric transformation element is for transforming a quantity of light incident thereon into an electric signal;

a circuit element for manipulating the electric signal, wherein the circuit element is provided in a surface portion of the first semiconductor chip that faces the second semiconductor chip; and a shielding film interposed between the first semiconductor chip and the second semiconductor chip to cover the circuit element and to bond the first and second semiconductor chips together.

2. The photosensor according to claim 1, wherein the shielding film is provided on a surface of the second semiconductor chip that is opposite to the photoelectric transformation element.

3. A photo sensor comprising:

a first semiconductor chip;

a second semiconductor chip mounted on the first semiconductor chip;

a photoelectric transformation element provided in a surface portion of the second semiconductor chip at a side opposite to the first semiconductor chip, wherein the photoelectric transformation element is for transforming a quantity of light incident thereon into an electric signal;

a circuit element for manipulating the electric signal, wherein the circuit element is provided in a surface portion of the first semiconductor chip that faces the second semiconductor chip; and a shielding film interposed between the first semiconductor chip and the second semiconductor chip to cover the circuit element, wherein the shielding film is made of an adhesive material for bonding the first and second semiconductor chips together.

4. The photo sensor according to claim 1, wherein the shielding film is formed on a surface of the first semiconductor chip.

5. The photo sensor according to claim 1, wherein the shielding film is made of metal.

6. The photo sensor according to claim 1, wherein the photoelectric transformation element is a photodiode.

7. The photo sensor according to claim 1, wherein the photo sensor detects the quantity of light incident thereon to control one of a vehicular air conditioner and a vehicular light.

8. A photo sensor comprising:

a first semiconductor chip;

a second semiconductor chip having a main surface for receiving light and a photoelectric transformation element provided on the main surface for transforming a quantity of the light into an electric signal, wherein the second semiconductor chip is bonded to the first semiconductor chip;

a circuit element provided in the first chip, below the photoelectric transformation element, for detecting the quantity of the light based on the electric signal; and a shielding film provided between the photoelectric transformation element and the circuit element for preventing the light from entering the circuit element and for bonding the first and second semiconductor chips together.

9. The photo sensor according to claim 8, wherein the shielding film is formed on a back surface of the second semiconductor chip at a side opposite to the main surface.

10. The photo sensor according to claim 8, wherein the shielding film is formed on a surface of the first semiconductor chip.

11. The photo sensor according to claim 8, wherein the surface are of the first semiconductor chip is larger than that of the second semiconductor chip.

12. The photo sensor according to claim 8, wherein:

the first semiconductor chip has a first surface region having the circuit element;

the first surface region is bonded to the second semiconductor chip with the shielding film located between the first semiconductor chip and the second semiconductor chip; and a second surface region having a conductive portion electrically connected to the photoelectric transformation element.

13. The photosensor according to claim 12, wherein the second surface region of the semiconductor chip has an open portion for electrically connecting the conductive portion to the photoelectric transformation element via a wire.

14. The photo sensor according to claim 8, further comprising:

a luminous energy control member located above the semiconductor chip for controlling the quantity of light incident on the semiconductor chip based on the incident angle of the light.

15. The photo sensor according to claim 14, wherein the luminous energy control member comprises:

an optical lens located above the semiconductor chip for changing the optical path of the light; and a slit plate located between the semiconductor chip and the optical lens and having a slit through which light incident on the semiconductor chip passes.

16. The photo sensor according to claim 1, wherein the first chip is bonded to the second chip by an adhesive.

17. The photo sensor according to claim 1, wherein the first chip is bonded to the second chip such that the first chip and the second chip form a stacked unit.

18. The photo sensor according to claim 1, wherein the photoelectric transformation element comprises a heavily doped P-type region within an N-type silicon substrate.

19. The photo sensor according to claim 1, wherein the circuit element comprises an IIL element.

* * * * *